United States Patent [19]

Hoke

[11] Patent Number: 5,060,030
[45] Date of Patent: Oct. 22, 1991

[54] PSEUDOMORPHIC HEMT HAVING STRAINED COMPENSATION LAYER

[75] Inventor: William E. Hoke, Wayland, Mass.

[73] Assignee: Raytheon Company, Lexington, Mass.

[21] Appl. No.: 554,240

[22] Filed: Jul. 18, 1990

[51] Int. Cl.[5] ............... H01L 29/80; H01L 29/161; H01L 27/12; H01L 27/14
[52] U.S. Cl. ........................... 357/22; 357/16; 357/4; 357/30
[58] Field of Search ............... 357/22 A, 22 MD, 16, 357/4, 30 B

[56] References Cited

FOREIGN PATENT DOCUMENTS 0225368 9/1989 Japan .................. 357/22 A

OTHER PUBLICATIONS

Cammarata, R. C. et al., Surface Stress Effects on the Critical Film Thickness for Epitaxy, Appl. Phys. Lett. 55 (12), Sep. 18, 1989, pp. 1197–1198.
Chin, Albert et al., Achievement of Exceptionally High Mobilities in Modulation-Doped $Ga_{1-x}In_xAs$ On InP Using A Stress Compensated Structure, J. Vac. Sci. Technol. B 8(2) May/Apr 90, pp. 364–366.
Vawter, G. Allen, Useful Design Relationships for the Engineering of Thermodynamically Stable Strained-Layer Structures, J. Appl. Phys. 65 (12), Jun. 15, 1989, pp. 4769–4773.
Van Vechten, J. A., New Set of Tetrahedral Covalent Radii, Physical Review B, vol. 2, No. 6, Sep. 15, 1970, pp. 2160–2167.

*Primary Examiner*—Rolf Hille
*Assistant Examiner*—Wael Fahmy
*Attorney, Agent, or Firm*—Denis G. Maloney; Richard M. Sharkansky

[57] ABSTRACT

A pseudomorphic high electron mobility transistor includes a substrate for supporting a semiconductor active region. The semiconductor active region includes a channel layer comprised of InGaAs, which when disposed over said substrate develops an intrinsic lattice tensile strain and charge donor layer comprised of a wide bandgap Group III-V material, said layer being arranged to donate charge to said channel layer. The HEMT further includes a strain compensating layer having an intrinsic lattice compressive strain which is disposed between said channel layer and said substrate. The strain compensating layer has a strain characteristic which compensates for the tensile strain in the channel layer permitting said channel layer to be grow thicker or with high In concentration prior to reaching its so-called critical thickness.

14 Claims, 2 Drawing Sheets

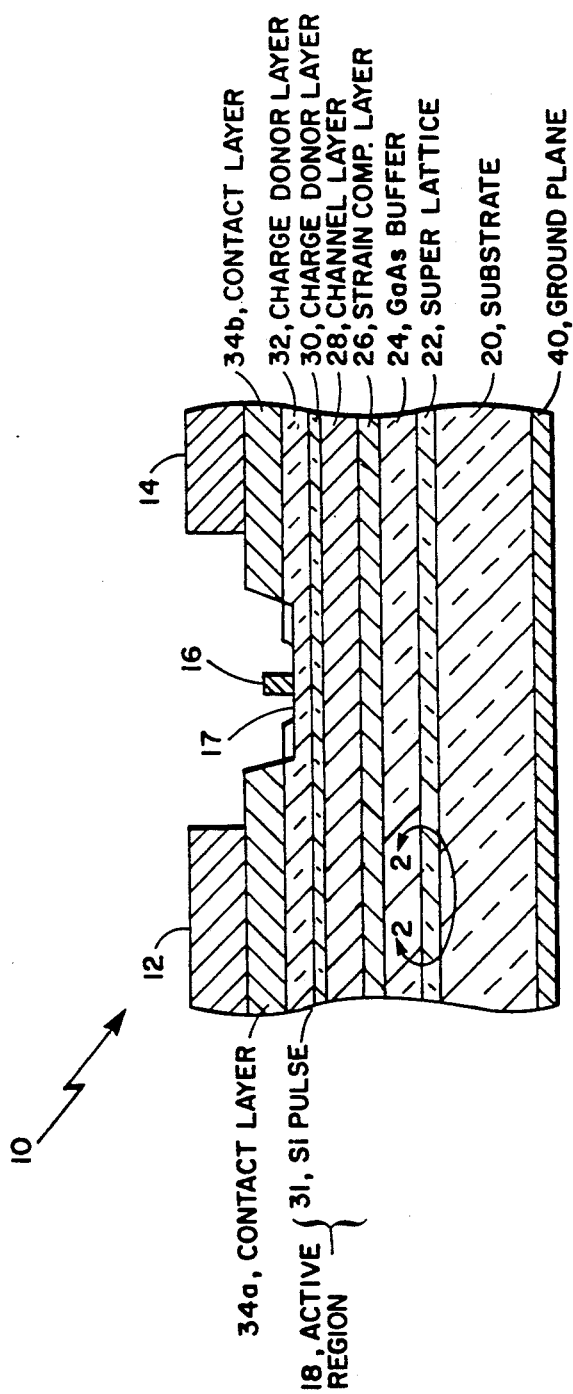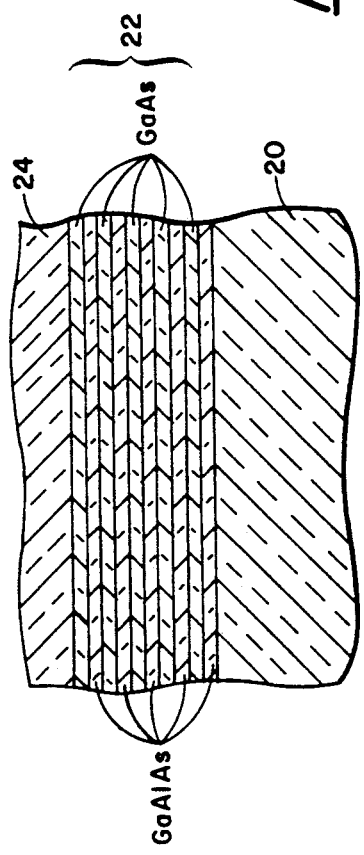

PSEUDOMORPHIC HEMT HAVING STRAINED COMPENSATION LAYER

BACKGROUND OF THE INVENTION

This invention relates generally to field effect transistors and more particularly to pseudomorphic field effect transistors.

As is known in the art, there are several types of field effect transistors (FETs) generally used at microwave and millimeter wave frequencies. These FETs include metal semiconductor field effect transistors (MESFETs) and high electron mobility transistors (HEMTs) each fabricated from Group III-V materials. What distinguishes a HEMT from a MESFET is that in a HEMT charge is transferred from an doped charge donor layer to an undoped channel layer. Generally the charge donor layer is a wide-band gap material such as AlGaAs, whereas the channel layer is a lower band gap material where band gap refers to the potential gap between the valence and conduction bands of the material There are generally two types of high electron mobility transistors One type is referred to simply as a HEMT whereas the other type is a pseudomorphic HEMT. The difference between the HEMT and the pseudomorphic HEMT is that in the pseudomorphic HEMT, one or more of the layers incorporated into the device has a lattice constant which differs significantly from the lattice constants of other materials of the device. Thus due to resulting lattice constant mismatch the crystal structure of the material forming the channel layer is strained. In a HEMT structure, charge is transferred from donor layer to an undoped channel layer. For Group III-V materials, the doped charge donor layer is comprised of a wide-band gap material such as gallium aluminum arsenide, whereas the channel layer is typically comprised of a lower bandgap material, such as gallium arsenide. A HEMT including an active region of AlGaAs and GaAs is unstrained, AlAs has a lattice constant $\alpha = 5.6605 Å$, whereas gallium arsenide has a lattice constant $\alpha = 5.6533 Å$. Since these lattice constants are similar, the channel layer is unstrained.

In the pseudomorphic HEMT, the undoped gallium arsenide channel layer is replaced by a channel layer comprised of a lower bandgap material, such as gallium indium arsenide. Indium arsenide has a lattice constant $\alpha = 6.0584$. Since indium arsenide has a substantially different lattice constant compared to either gallium arsenide or aluminum arsenide, indium incorporation provides a crystal having a lattice constant which is substantially larger than the lattice constant of gallium arsenide or gallium aluminum arsenide. This lattice mismatch makes practical growth of such devices difficult and otherwise limits several advantages which would accrue to a device using GaInAs as the channel layer. For example, the use of gallium indium arsenide in a HEMT provides several performance advantages over gallium arsenide. Since gallium indium arsenide has a smaller bandgap than gallium arsenide, the conduction band discontinuity at the gallium aluminum arsenide/gallium indium arsenide heterojunction is increased thereby increasing the charged density transferred into the channel layer. Moreover, gallium indium arsenide also has a higher electron mobility and higher electron saturated velocity than gallium arsenide. Each of these benefits thus provides a pseudomorphic HEMT which can handle higher power levels, as well as, operate at higher frequencies with improved noise properties than a HEMT using gallium arsenide as the channel layer. Moreover, these benefits increase with increasing indium concentration (X) in the $Ga_{1-x}In_xAs$ layer.

Accordingly, a major objective in fabricating a high performance pseudomorphic HEMT structure is to maximize the amount of indium contained in the gallium indium arsenide layer. A problem arises, however, in increasing indium concentration. As mentioned above, gallium indium arsenide has a lattice constant which is larger than gallium arsenide or gallium aluminum arsenide, with the latter having substantially equal lattice constants. This disparity in lattice constants increases with increasing indium concentration. Thus, when gallium indium arsenide is disposed over the gallium arsenide, the film develops intrinsic stresses which induces a very high tensile strain in the gallium indium arsenide. For a gallium indium arsenide layer which is thicker than the so-called "critical thickness" of the GaInAs layer on gallium arsenide or gallium aluminum arsenide, this intrinsic strain causes the gallium indium arsenide film to be disrupted with formation of various types of crystal dislocations or defects. The presence of such crystal dislocations seriously degrade the electron transport properties of the GaInAs layer. For a gallium indium arsenide layer having a thicknesses less than the so-called critical thickness of the layer, the material is elastically strained without these dislocations forming. In the growth plane, the GaInAs layer takes on the lattice constant of the underlying gallium arsenide or gallium aluminum arsenide layer, whereas the crystal of the GaInAs is deformed such that in a plane perpendicular to the growth plane the crystal is expanded. This type of layer is termed "pseudomorphic" from which is developed the term pseudomorphic HEMT. With increasing indium concentration, the critical thicknesses at which the GaInAs layer forms crystal defects decreases. For example, for a channel layer comprised of gallium aluminum arsenide having the concentration $Ga_{0.8}In_{0.2}As$ a layer thickness of approximately 100Å is the maximum thickness. Layers thinner than approximately 100Å are not attractive due to the increased importance of the quantum size effect which reduces the effective bandgap discontinuity. Thicknesses much above 100Å result in the above-mentioned lattice dislocation problem.

SUMMARY OF THE INVENTION

In accordance with the present invention, a high electron mobility transistor includes a substrate for supporting a semiconductor active region, said semi-conductor active region including a channel layer and a charge donor layer. The channel layer is comprised of a narrow bandgap Group III-V material having an element which causes said material to have a lattice mismatch to that of the substrate. The narrow bandgap material, when disposed over said substrate develops an intrinsic lattice strain. The charge donor layer is comprised of a wide bandgap Group III-V material and is arranged to donate charge to said channel layer. The HEMT further includes a strain compensation layer having an intrinsic lattice strain opposite to that of the channel layer which is disposed between said channel layer and substrate. With this particular arrangement, the critical thickness of the channel layer of a pseudomorphic HEMT may be increased or alternatively the concentration of the element of the material of the channel layer may be increased. Either advantage would significantly improve device performance characteristics. The strain compensating layer has a strain characteristic which is opposite in magnitude to the strain characteristic of the channel layer. The composite layer provided has a pair of lattice strains which compensate one another. Since strains are compensated, either the thickness or alternatively the concentration of the element in the channel layer may be increased over that obtained without the strain compensating layer.

In accordance with a further aspect of the present invention, a high electron mobility transistor includes a substrate for supporting a semiconductor active region, said semiconductor active region including a channel layer comprised of a narrow bandgap Group III-V material, which when disposed over said substrate develops an intrinsic lattice tensile strain and a charge donor layer comprised of a wide bandgap Group III-V material, said layer being arranged to donate charge to said channel layer. The HEMT further includes a strain compensation layer having an intrinsic lattice compressive strain disposed between said channel layer and said substrate. With this particular arrangement, the critical thickness of the channel layer of a pseudomorphic HEMT may be increased or alternatively the concentration of indium could be increased. Either advantage will significantly improve device performance characteristics. The strain compensating layer has a compressive strain characteristic which is opposite in magnitude to the tensile strain characteristic of the indium gallium arsenide layer, whereas the composite layer provided has a pair of lattice strains which compensate one another. Since strains are compensated, this permits either the thickness or alternatively the indium concentration in the gallium indium arsenide layer to be increased over that obtained without the strain compensating layer.

In accordance with a still further aspect of the present invention, the strained compensating layer is a material of the form CBAs, where C is selected from the group consisting of Ga and Al, and B is selected from the group consisting of N,P,B, and Sc.

BRIEF DESCRIPTION OF THE DRAWINGS

The foregoing features of this invention, as well as the invention itself, may be more fully understood from the following detailed description of the drawings, in which:

FIG. 1 is a cross-sectional view of a pseudomorphic HEMT incorporating a strain compensation layer in accordance with the present invention;

FIG. 2 is a blown-up cross-sectional view of a portion of FIG. 1 taken along line 2—2 of FIG. 1.

DESCRIPTION OF THE PREFERRED EMBODIMENTS

Figure 3:
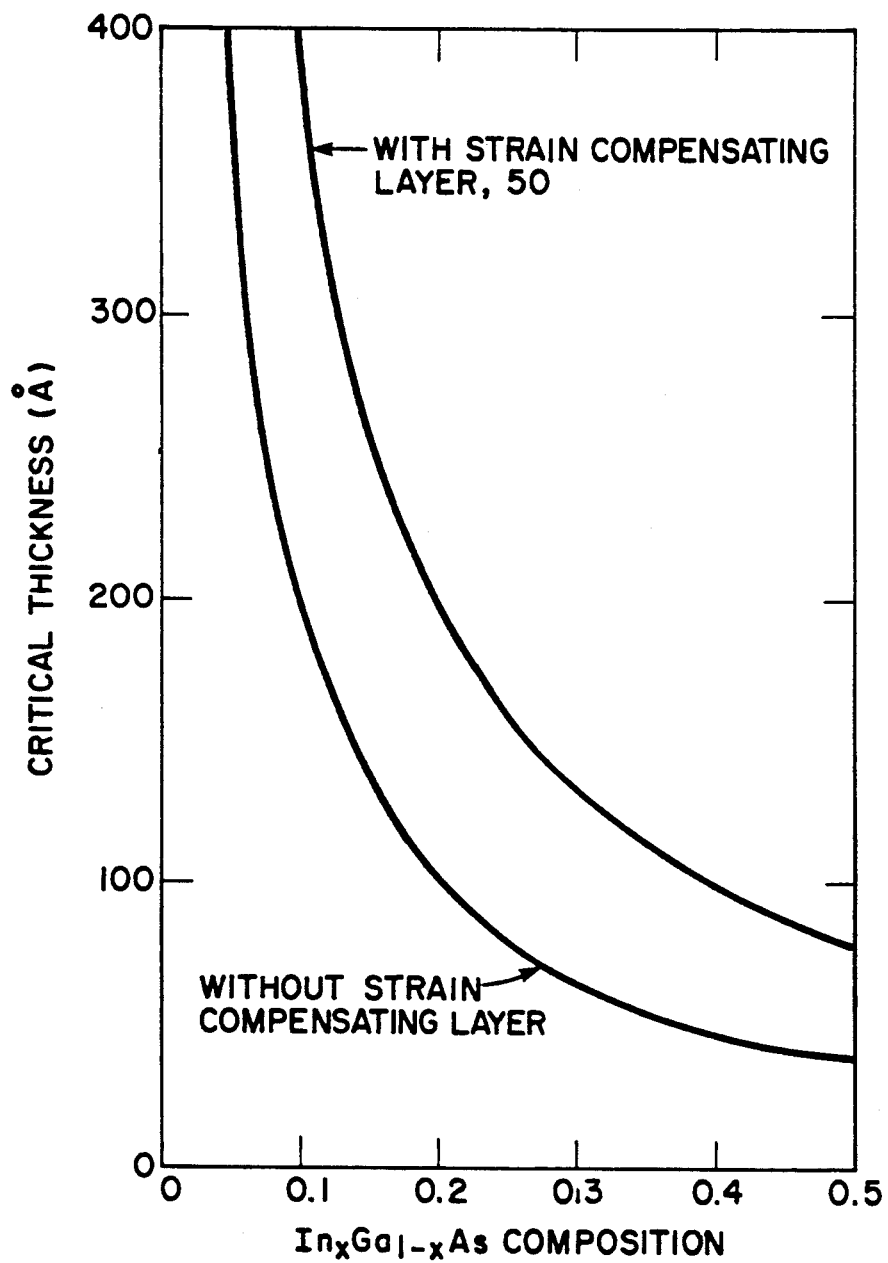
FIG. 3 is a plot of thickness vs. composition of a channel layer in accordance with the present invention.

Referring now to FIGS. 1 and 2, a pseudomorphic high electron mobility transistor (HEMT) 10 is shown to include source and drain contacts 12, 14 disposed in ohmic contact with contact layers 34a, 34b, and a gate contact 16 with said gate contact disposed in Schottky barrier contact with an underlying composite active region 18. The HEMT 10 further includes a substrate 20 having disposed over a first surface thereof a ground plane conductor 40 and having disposed over a second opposite surface thereof an optional superlattice 22, here comprised of alternating, undoped layers of gallium arsenide and gallium aluminum arsenide with each of such layers having a thickness of typically 20Å, as shown in FIG. 2. Disposed over optional superlattice 22 is a buffer layer 24, here comprised of undoped gallium arsenide having a typical thickness of 10,000Å but generally having a thickness in the range of 1,000Å to 10,000Å.

Disposed over gallium arsenide buffer layer 24 is a strain compensation layer 26, here comprised of a material which will develop an inherent or intrinsic compressive strain when grown over gallium arsenide layer 24 (or alternatively if layer 24 was aluminum gallium arsenide would develop an intrinsic compressive strain grown over aluminum gallium arsenide). Materials which may be used for strain compensation layer 26 have the general formula of CBAs where C is selected from the group consisting of gallium and aluminum and B is selected from the group consisting of nitrogen, phosphorus, boron, and scandium. Here a preferred example of the material for strain compensation layer 26 is boron gallium arsenide having a composition of $B_xGa_{1-x}As$ where x has a range of 0.01 to 0.5, a preferred ratio in the range of 0.05 to 0.3 and most preferably ratio of x=0.15.

In general, the material of the strain compensation layer will have a composition ratio X selected to provide a layer having an intrinsic compressive stress which substantially compensates for the intrinsic tensile stress of the channel layer disposed over the strain compensation layer, as will now be described. A channel layer 28 is here disposed over strain compensation layer 26. Channel layer 28 is here comprised of gallium indium arsenide having a thickness in the range of 100Å–400Å and a composition of $Ga_{1-x}In_xAs$ where x is the composition ratio of In to As and is in the range of 0.2–0.5. Preferably, the composition/thickness relationship of the channel layer 28 is related to curve 50 as shown in FIG. 3. Composition and thickness relationships taken along line 50 would be preferred combinations for the HEMT 10. By disposing the strain compensation layer 26 between the gallium arsenide buffer 24 and the channel layer 28, the channel layer may be grown to a larger thickness than if the channel layer 28 were grown directly on the gallium arsenide buffer 24 or a gallium aluminum arsenide buffer 24. Alternatively, the indium concentration in the channel layer 28 may be increased or any combination of the aforementioned arrangements may be provided to form a channel layer 28 having approximately twice the tensile strain as said channel layer would have without the strain compensating layer 26. Insertion of the strain compensation layer permits a thicker channel layer or alternatively a higher concentration of In in said channel layer before the channel layer reaches a sufficiently high enough tensile strain to cause dislocations in the crystal lattice of said layer. With the above arrangement, the compensation layer is grown to a thickness approaching, but not exceeding, the critical thickness of the compensation layer. The channel layer is grown adjacent, here over the compensation layer. The initial growth of the channel layer would provide a layer having tensile strains which were compensated for by the compressive strains in the underlying compensating layer 26. After the channel layer is grown to a first thickness of zero net strain (i.e. compensated for by the compressive strain of the compensating layer 26), the channel layer is grown to an additional thickness until the channel layer additional thickness reaches the so-called critical thickness of the layer. With the compensation layer as mentioned above, either the thickness of layer 28 or the concentration of In in layer 28 may be increased by approximately a factor of two. By either incorporating additional indium into the channel layer 28 or by increasing the thickness of the channel layer 28, a higher electron mobility and higher electron saturation velocity are provided in such layer thereby improving the overall performance of the HEMT 10, that is, permitting the HEMT 10 to handle larger amount of currents and thus power at higher frequencies. Further, an increase in In concentration increases the conduction band discontinuity between AlGaAs and InGaAs. This increases the current sheet density which also improves power performance.

Disposed over channel layer 28 is a charge donor layer 32. Here the charge donor layer 32 has a portion 30 disposed directly over channel layer 28, separated from the main portion of the charged donor layer 32 by a sub-monolayer of silicon atoms having a concentration of typically $1 \times 10^{12}$ to $6 \times 10^{12}$ atoms per square centimeter. Ideally, the silicon sub-monolayer 31 or dopant pulse is formed as a sub-monolayer but in practice may actually diffuse during growth to be several atomic layers thick. Disposed over the silicon pulse monolayer 31 is the remainder of the charge donor layer 32, here with layer 30 and 32 being comprised of a wide bandgap, undoped material such as gallium aluminum arsenide having a composition of $Ga_{1-x}Al_xAs$ where x is in the range of 0.15 to 0.3. Disposed over the charge donor layer 32 are contact regions 34a, 34b, here comprised of gallium arsenide having a silicon dopant concentration of $1 \times 10^{18}$ to $6 \times 10^{18}$ atoms/cc. Disposed over said contact regions 34a, 34b are the source and drain electrodes 12, 14, which are disposed in ohmic contact with the underlying contact regions 34a, 34b as would otherwise be known to one of skill in the art. The donor layer 32 is selectively recessed in a region thereof disposed being source and drain contacts 12, 14 to provide a gate recess 17 within which is disposed a gate electrode 16 in Schottky barrier contact with the charged donor layer 32, as would also be known of one of skill in the art. Preferred materials and typical thickness for providing Schottky barrier contact for the gate electrode 16 include metals, such as Ti 1,000Å/Pt 1,000Å and Au 3,000Å. Similarly, drain and source electrodes generally comprise Ni 50Å, Au-GE 900Å, Ni 300Å, and Au 4,000Å.

The HEMT 10, as generally described in conjunction with FIGS. 1 and 2 is fabricated by providing a substrate 20, here of gallium arsenide or other suitable Group III-V material or silicon over which is sequentially deposited the superlattice 22, buffer layer 24, strain compensation 26, channel layer 28, charge donating layers 30 and 32, and silicon pulse submono-layer 31, and contact layer (not numbered) here each of said layers being fabricated by molecular beam epitaxial (MBE) techniques or alternatively by metalorganic chemical vapor deposition (MOCVD) techniques. Such layers are sequentially grown, as would be known to one of skill in the art. Thereafter, the layers are etched to at least the buffer layer 24 or superlattice 22 to isolate the individual mesas (not shown) of HEMT 10 provided over substrate 20. Source and drain electrodes are disposed over the mesas and are alloyed to the underlying contact layer by heat treatment as is well known in the art to provide low ohmic contacts as is generally used with MESFETs, for example. After formation and alloying of the source and drain contact, the contact layer (not numbered) is etched to provide the aforementioned contact regions 34a, 34b. The charge donor layer 32 is provided with a recess 17 within which is disposed the Schottky barrier gate electrode 16 as generally described above. The Schottky barrier contact 16 controls conduction of electrons in the channel layer 28 which are provided from transfer of species from the charge donor layer 32.

With the channel layer having a higher concentration of In than is possible without use of the strain compensation layer 26 or alternatively a greater thickness, or some combination thereof, the channel layer will have a higher electron mobility, higher saturation velocity, and higher current density, and thus will provide a pseudomorphic HEMT having improved device characteristics.

Having described preferred embodiments of the invention, it will now become apparent to one of skill in the art that other embodiments incorporating their concepts may be used. It is felt, therefore, that these embodiments should not be limited to disclosed embodiments, but rather should be limited only by the spirit and scope of the appended claims.

What is claimed is:

1. A high electron mobility transistor comprising:
   substrate means comprising a material having a first lattice constant characteristic for supporting a semiconductor active region;
   a strain compensation layer disposed between said semiconductor active region and said substrate means said strain compensation layer comprised of a material having a second lattice characteristic which when disposed over said substrate means provides said strain compensation layer having a first intrinsic lattice strain characteristic;
   said semiconductor active region comprising:
      a channel layer comprised of a narrow band Group III-V material different from the material of the strain compensation layer, said material having a third, different lattice constant characteristic which when disposed over said strain compensation layer develops a second, different intrinsic lattice strain characteristic opposite to that of the first intrinsic lattice strain characteristic which is compensated by the first intrinsic lattice strain characteristic of the strain compensating layer; and
      a charge donor layer comprised of a wide bandgap Group III-V material, said layer disposed to donate charge to said channel layer; and
      means for providing ohmic source and drain contacts disposed over said semiconductor active region and a gate electrode disposed on said active region for controlling conduction in said channel layer.

2. The high electron mobility transistor as recited in claim 1, wherein said channel layer has an intrinsic tensile strain and said compensating layer has an intrinsic compressive strain.

3. The high electron mobility transistor as recited in claim 2, wherein said strain compensation layer is comprised of material having the general chemical formula of CBAs where C is selected from the group consisting of gallium and aluminum and B is selected from the group consisting of nitrogen, phosphorus, boron, and scandium and As is arsenic.

4. A high electron mobility transistor comprising:

a substrate of gallium arsenide;

a superlattice disposed over said substrate comprised of alternating layer pairs of gallium arsenide and aluminum gallium arsenide;

a buffer layer disposed over said superlattice, said buffer layer comprising a material selected from the group consisting of gallium arsenide and gallium aluminum arsenide;

a strain compensating layer disposed over said buffer layer, said strain compensating layer having a general chemical formula of CBAs, where C is selected from the group consisting of gallium and aluminum and B is selected from the group consisting of nitrogen, phosphorus, boron, and scandium and As is arsenic;

a channel layer disposed over said strain compensating layer comprised of gallium indium arsenide;

layer means for donating electric charge to said channel layer comprising a layer of gallium aluminum arsenide;

contact means disposed over said charged donor layer for providing source and drain ohmic contacts; and a gate electrode disposed in Schottky barrier contact with said charged donor layer.

5. The transistor as recited in claim 4, wherein said channel layer of gallium indium arsenide ($Ga_{1-x}In_xAs$) where x is in the range of 0.2–0.5.

6. The transistor as recited in claim 5, wherein the thickness of said channel layer is in the range of 100Å–300Å.

7. The transistor as recited in claim 4, wherein said strain compensating layer has a thickness in the range of 100Å–10,000Å.

8. The transistor as recited in claim 6, wherein said strain compensating layer has a thickness in the range of 100Å–10,000Å.

9. The transistor as recited in claim 6 further comprising a dopant of Si of about $(1 \text{ to } 8) \times 10^{12}$ atoms/cm$^2$ disposed in said charge donor layer.

10. The transistor of claim 9, wherein said compensating layer is $B_xGa_{1-x}As$, where x is in the range of 0.01 to 0.5 and the layer has a thickness in the range of 100Å to 10,000Å.

11. The transistor of claim 4 wherein said strain compensating layer is boron gallium arsenide.

12. The transistor of claim 10 wherein said strain compensating layer is boron gallium arsenide.

13. The transistor of claim 4 wherein said strain compensating layer is gallium arsenide phosphide.

14. The transistor of claim 10 wherein said strain compensating layer is gallium aluminum arsenide phosphide.

* * * * *